(12) United States Patent
McCullough

(10) Patent No.: US 6,445,439 B1
(45) Date of Patent: Sep. 3, 2002

(54) EUV RETICLE THERMAL MANAGEMENT

(75) Inventor: Andrew W. McCullough, Newtown, CT (US)

(73) Assignee: SVG Lithography Systems, Inc., Wilton, CT (US)

( * ) Notice: Subject to any disclaimer, the term of this patent is extended or adjusted under 35 U.S.C. 154(b) by 0 days.

(21) Appl. No.: 09/473,259

(22) Filed: Dec. 27, 1999

(51) Int. Cl.$^7$ .......................... G03B 27/52; G03B 27/62
(52) U.S. Cl. ........................................ 355/30; 355/75
(58) Field of Search .............................. 355/53, 30, 55, 355/67, 72, 77, 75; 250/216; 430/311

(56) References Cited

U.S. PATENT DOCUMENTS

| | | | |
|---|---|---|---|
| 4,202,623 A | * 5/1980 | Watkin | 355/30 |
| 4,720,732 A | * 1/1988 | Tsutsui | 355/30 |
| 5,063,582 A | * 11/1991 | Mori et al. | 378/34 |
| 5,220,171 A | * 6/1993 | Hara et al. | 250/443.1 |
| 5,577,552 A | * 11/1996 | Ebinuma et al. | 165/296 |
| 5,610,965 A | * 3/1997 | Mori et al. | 378/34 |
| 6,153,877 A | * 11/2000 | Ashida | 250/216 |

* cited by examiner

*Primary Examiner*—Russell Adams
*Assistant Examiner*—Hung Henry Nguyen
(74) *Attorney, Agent, or Firm*—Fattibene & Fattibene; Paul A. Fattibene; Arthur T. Fattibene

(57) ABSTRACT

A thermal management device for use with a photolithographic apparatus or tool substantially reducing thermal distortion in a reticle. Planar cooling elements are placed adjacent a reticle being illuminated with extreme ultraviolet, EUV, electromagnetic radiation. A heating element provides heat prior to exposure of the reticle by the EUV electromagnetic radiation and the system is in thermal equilibrium. Upon exposure of the EUV electromagnetic radiation, absorption by the reticle causes heat. The heating element is controlled to reduce the heat provided so the extra heat load generated in the reticle during exposure due to absorption of the EUW electromagnetic radiation is compensated for. The reticle therefore experiences no net heat or thermal energy change, and therefore eliminates or substantially reduces both expansion and thermal gradients in the reticle. The reduction of thermal gradients in the reticle substantially reduces distortion resulting in better imaging of the reticle onto a photosensitive substrate. The present invention is particularly applicable to a scanning photolithographic system used in the manufacture of semiconductors or electronic devices.

28 Claims, 3 Drawing Sheets

US 6,445,439 B1

EUV RETICLE THERMAL MANAGEMENT

FIELD OF THE INVENTION

The present invention relates generally to photolithography as used in the manufacture of semiconductor devices, and more particularly to controlling the temperature of a reticle in a scanning photolithographic system.

BACKGROUND OF THE INVENTION

In photolithography as used in the manufacture of electronic or semiconductor devices, a reticle or mask containing a circuit pattern thereon is imaged through projection optics onto a photosensitive or resist covered substrate. Often, very high quality images are required with feature sizes now tending towards 100 nm. In the EUV, extreme ultraviolet, range these sizes may shrink to tens of nanometers. In order to achieve the required high quality images and very small feature sizes, an option for illumination sources for projecting the image of the mask or reticle onto the photosensitive substrate will require the use of electromagnetic radiation having a wavelength in the extreme ultraviolet, EUV. Often, in order to achieve a required exposure dose, the illumination source must be of a relatively high energy or high level of flux. The mask or reticle will absorb a significant fraction of this energy. In the EUV the reticle is reflective. The amount of energy absorbed in the high reflectance zone is thirty-two percent for present coatings for the reflective portion of a mask or reticle and one hundred percent for an absorbing or non reflective portion of a mask or reticle. As a result, the reticle will increase overall in temperature and this increase may be uneven and pattern dependent causing non correctable distortion. Performance is therefore adversely affected. The heating or warming of the reticle is often complicated because the system is generally placed in a vacuum. Additionally, the heating of the reticle is often complicated in a scanning photolithographic system, where a high energy illumination field is scanned across the surface of the reticle. Therefore, there is a need to improve the thermal management of a reticle in a photolithographic system, and in particular a scanning photolithographic system.

SUMMARY OF THE INVENTION

The present invention is directed to an apparatus and method for managing the thermal energy absorbed by a reticle. The basic concept is to provide an extra heat/cooling delivery so that the reticle always has a constant heat load and this heat load is independent of the flux on the wafer. The heat load is comprised of an adjustable heater such that the load from this heat source plus the incident flux heat load is maintained constant. A substantially planar cooling element is positioned adjacent the reticle. The cooling element has an aperture therein for transmitting an illumination field from an illumination source. Adjacent the illumination aperture is positioned a heating element. The cooling and heating elements are balanced so that no net temperature change occurs and thus the reticle remains in thermal balance. Heat is provided from two sources, heat from the heating element and heat from the EUV electromagnetic radiation absorbed by the reticle. Selective control of the heating element considering the rate of absorption of the reticle during an exposure dose of EUV electromagnetic radiation results in much reduced flux induced thermal distortion of the reticle, as it is now in an isothermal environment. In another embodiment, the temperature changes of the heating element in a direction perpendicular to a direction of scan may be modified to compensate for an uneven or pattern dependent absorption pattern in the reticle. A suitable inert gas may be introduced between the reticle and the heating and cooling elements to provide cleaning of the reticle by known thermophoretic methods.

Accordingly, it is an object of the present invention to minimize or prevent thermal distortion of a reticle, thereby improving image quality, and minimize any induced overlay error.

It is another object of the present invention to improve thermal management of a reticle in a scanning photolithographic system.

It is an advantage of the present invention that it is easily adjustable for different reticle patterns with different absorption.

It is a further advantage of the present invention that it is readily adaptable to thermophoretic cleaning of the reticle.

It is a key feature of the present invention that heating and cooling elements are simultaneously used.

It is yet another feature of the present invention that a heating element is used and with the energy absorbed by the reticle from the EUV illumination, is maintained at a constant thermal load.

These and other objects, advantages, and features will become readily apparent in view of the following more detailed description.

DETAILED DESCRIPTION OF THE PREFERRED EMBODIMENTS

Figure 1:
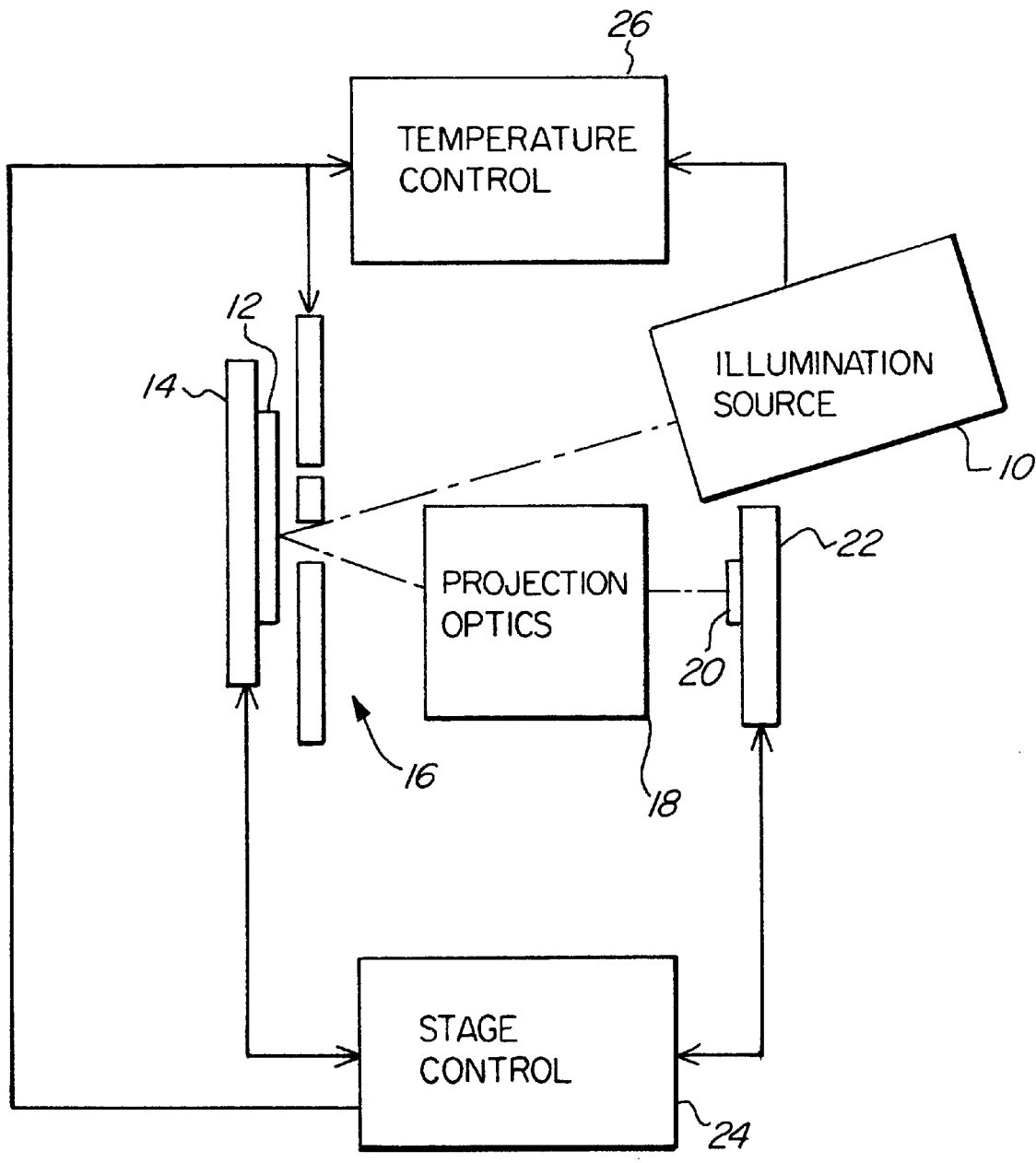
FIG. 1 schematically illustrates a photolithographic system having a reticle thermal management device.

FIG. 1 schematically illustrates an embodiment of the present invention. FIG. 1 schematically illustrates a photolithographic system or tool utilizing a thermal management device 16. An illumination source 10 provides electromagnetic radiation having a wavelength in the extreme ultraviolet, EUV, to a reflective reticle or mask 12.

In another embodiment or configuration the reticle or mask 12 need not be a reflective reticle. Therefore, the illumination would be transmitted through the reticle. Additionally, the illumination source may provide electromagnetic radiation of any wavelength, and clearly is not restricted to EUV.

The reticle or mask 12 is positioned on a reticle stage 14. The electromagnetic radiation from illumination source 10 enters and exits an aperture in the thermal management device 16. The reflected electromagnetic radiation is collected by projection optics 18. The projection optics 18 is generally reflective in the EUV, but could be refractive or a combination thereof at other wavelengths than EUV. The projection optics 18 image the reticle onto a photosensitive substrate or wafer 20 having a photosensitive resist coating thereon. The projection optics 18 will typically have a magnification less than one, forming a reduced image of the reticle. Often, the magnification is a reduction ration of 4:1, but other ratios can be used. The photosensitive substrate 20 is placed on a substrate or wafer stage 22. Movement of the reticle or mask stage 14 and the substrate or wafer stage 22 is controlled by stage control 24. Preferably, the reticle or mask stage 14 and the substrate or wafer stage 22 are synchronously scanned so that a scanning exposure is obtained and the entire image of the reticle 12 is reproduced onto the photosensitive substrate 20. The relative speed of the reticle or mask stage 14 and the substrate or wafer stage 22 is proportional to the magnification of the projection optics 18. A temperature control 26 is coupled to the thermal management device 16, the stage control 24, and the illumination source 10.

The thermal management device 16 manages or compensates for heat energy created in or on the reticle due to absorption of the EUV electromagnetic radiation from the illumination source 10. The thermal management device 16 eliminates or considerably reduces thermal distortion of the reticle 12. The thermal management device 16 is particularly beneficial as shorter wavelengths of electromagnetic radiation are utilized to image smaller feature sizes.

Figure 2:
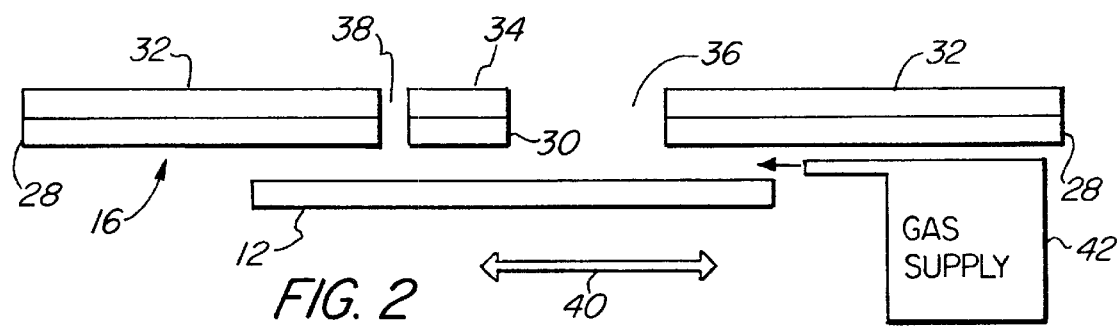
FIG. 2 schematically illustrates a reticle thermal management device.
Figure 3:
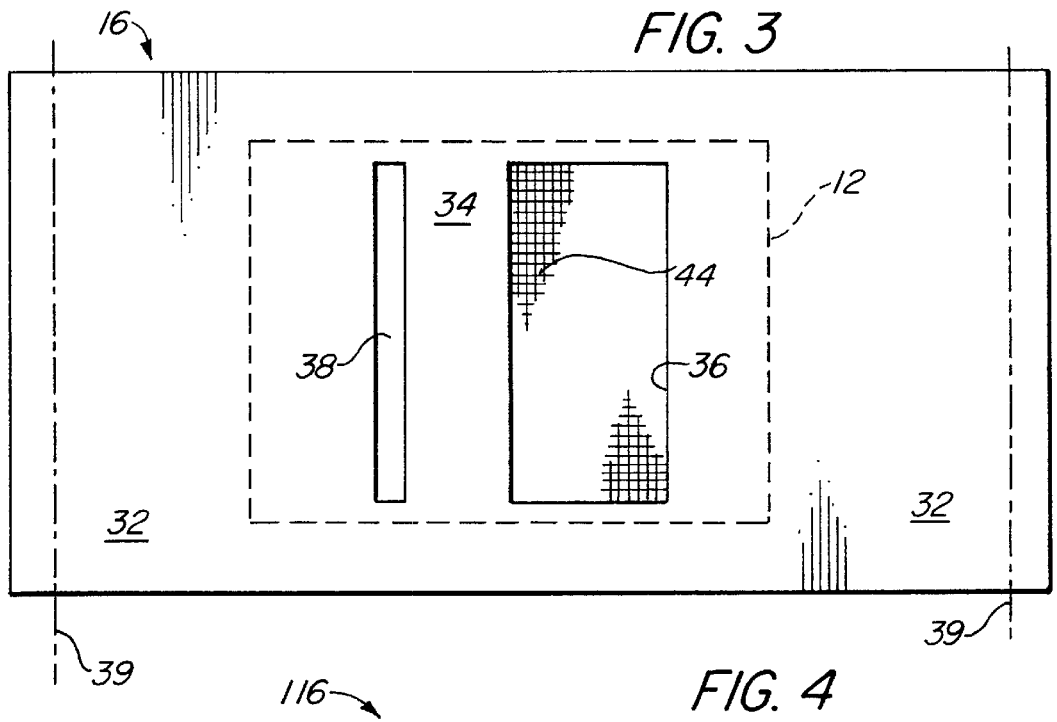
FIG. 3 is a plan view schematically illustrating the reticle thermal management device.

FIG. 2 schematically illustrates the operation of the present invention. The thermal management device 16 comprises a substantially planar cooling element 28. Between the cooling elements 28 is positioned a heating element 30. The heating element 30 is placed adjacent an illumination aperture 36. The heating element 30 is placed adjacent to the reticle 12 and provides heat to a portion of the reticle 12. An isolation Space 38 is placed between a cooling element 28 and the heating element 30. A gas supply 42 may be utilized to provide an appropriate inert gas flow between the mask or reflective reticle 12 and the thermal management device 16. This helps keep the reticle clean by thermophoretic methods, if desired. It may also contribute to the thermal coupling of cooling elements 28 and heating elements 30 to the reticle. Arrow 40 represents the direction of scanning of the reflective reticle 12. Additionally, insulation 32 may be placed over the cooling elements 28 and insulation 34 may be placed over the heating element 30, FIG. 3 is a plan view of the thermal management device 16. As can be seen from FIG. 3, the reticle 12 is placed adjacent or under the thermal management device 16. Dashed lines 39 represent the scan limits of the reticle 12. A pattern 44, on the reticle 12, to be imaged, a portion of which is illustrated through the illumination aperture 36, represents the generally orthoganal circuit patterns formed on a reticle to be reproduced on the photosensitive substrate. Insulation 34 over the heating element 30 is illustrated adjacent the illumination aperture 36. It should be appreciated that the isolation space 38 is illustrated as a space. However, isolation space 38 may easily be filled in with insulation or other suitable material. Additionally, the heating element schematically illustrated may be any heating element such as a wire grid, or a radiation source such as an infrared laser or a lamp. Other equivalent heating elements may be utilized. The heating element used should have a quick response and be of low thermal mass. Therefore, rapid changes in temperature of the heating element can be achieved.

Figure 4:
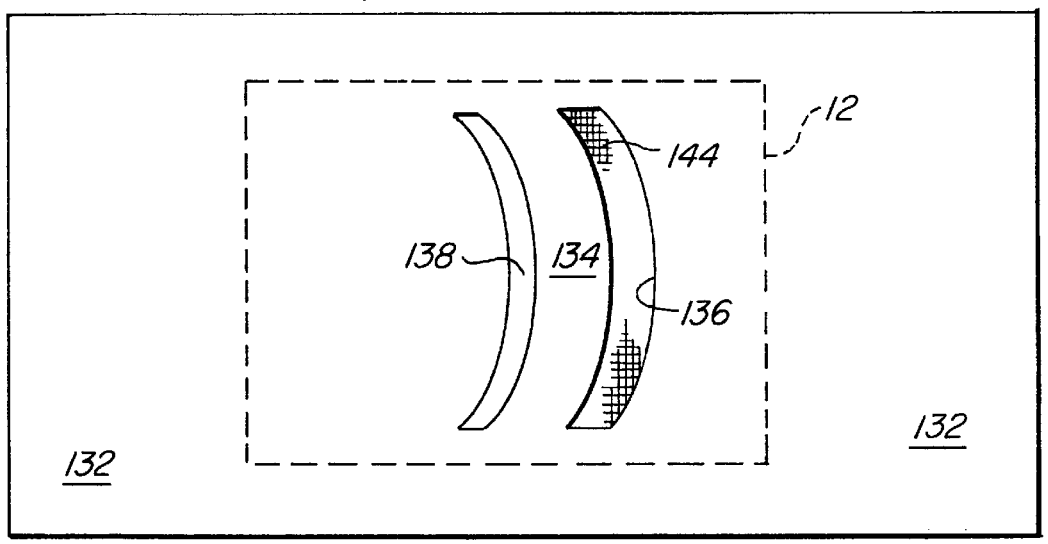
FIG. 4 is a plan view illustrating another embodiment of a reticle thermal management device operating with a system having an arcuate illumination aperture.

FIG. 4 illustrates another embodiment of the present invention. In this embodiment, a plan view of a thermal management device 116 is illustrated. The thermal management device 116 has an arcuate illumination aperture 136 as well as an adjacent arcuate insulation 134 covering an arcuate heating element. The isolation space 138 may also be arcuate. Insulation 132 covers cooling elements. This embodiment, illustrated in FIG. 4, illustrates the use of the present invention for an illumination field having an arcuate shape. However, the illumination aperture 136 may be made to conform to any desired illumination field.

Figure 5:
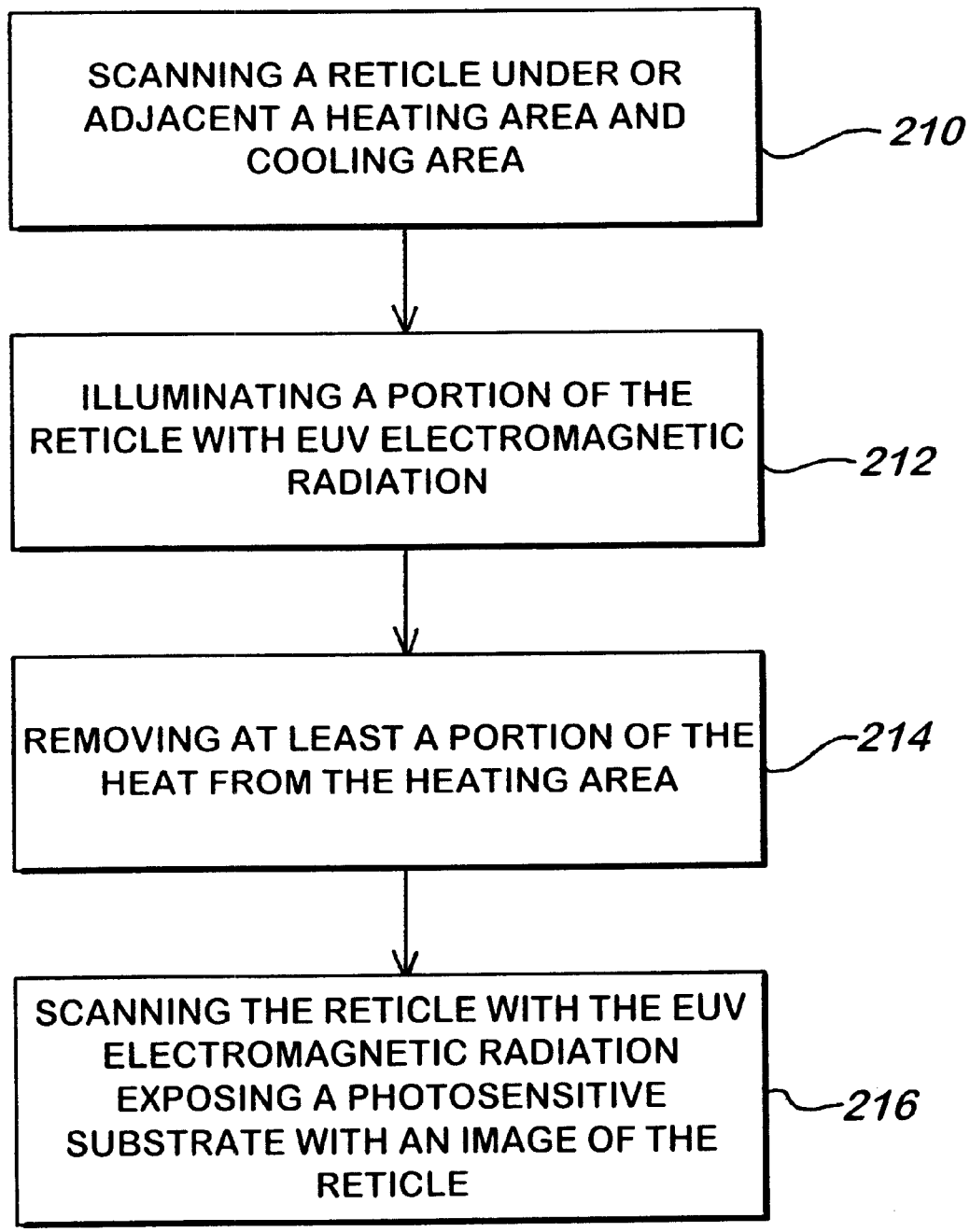
FIG. 5 is a block diagram illustrating the method steps of another embodiment of the present invention.

FIG. 5 is a block diagram illustrating the method steps or acts used in practicing an embodiment of the present invention. Block 210 represents the step or act of scanning a reticle adjacent or under a heating area and cooling area. Block 212 represents the step or act of illuminating a portion of the reticle with extreme ultraviolet, EUV, electromagnetic radiation. Block 214 represents the step or act of removing or reducing a portion of the heat from the heated area. Block 216 represents the step or act of scanning the reticle with the extreme ultraviolet, EUV, electromagnetic radiation, exposing a photosensitive substrate with an image of the reticle.

The present invention and the various embodiments may be readily appreciated with reference to the figures. An illumination source 10 forms an illumination field that is used to sequentially project the image of a reticle 12 onto a photosensitive substrate 20 as the reticle 12 and substrate 20 are scanned synchronously. Because only a portion of the reticle 12 is illuminated at any one time, and in view of the high absorption of the EUV electromagnetic radiation by portions of the reticle, the reticle may be distorted due to uneven heating or temperature gradients within the reticle. Thermal management device 16 provides cooling elements 28 and a heating element 30 for controlling thermal energy and preventing distortion of the reticle 12. The cooling elements 28 remove thermal energy at the same rate as provided by heating element 30. Accordingly, no net thermal energy is provided to the reticle 12. The reticle 12 may be continuously scanned in the direction of arrow 40 so that the reticle obtains thermal equilibrium with only a very low transient low magnitude thermal surface wave at the scan rate occurring. When an exposure is to be taken and the image of the reticle 12 projected or formed on the photosensitive substrate 20, extreme ultraviolet electromagnetic radiation enters the illumination aperture 36 and illuminates the reticle 12. A portion of this electromagnetic radiation, typically between 32% and 100% is absorbed by the reticle 12. The energy provided to the heating element 30 is removed or reduced to exactly compensate for the thermal energy created by the absorption of electromagnetic radiation in the reticle 12. As a result, the reticle 12 experiences no net thermal load change, eliminating or substantially reducing any distortion created as a result of the thermal heating of the reticle due to the absorption of the extreme ultraviolet electromagnetic radiation. Temperature control 26 provides the heating and cooling commands to the thermal management device 16. The signals provided to the heating and cooling elements 28 and 30 can be sequenced during a scanning operation so that even if the reticle 12 has uneven absorption at different locations in the scan direction, the heating element 30 can be adequately controlled temporally to compensate for each spatial location on the reticle 12. Additionally, the heating element 30 may be controlled spatially along a direction perpendicular to the scan direction to additionally compensate for any differences in the rate of absorption of the reticle in a direction perpendicular the scan direction or longitudinally along the illumination aperture 36. The thermal management device of the present invention can therefore very easily be controlled to compensate for different thermal absorptions on the reticle 12. Accordingly, the present invention greatly aids in the thermal management of a reticle 12 and substantially eliminates or reduces distortion caused by thermal gradients in the reticle 12. While the present invention is particularly suited to photolithographic tools using a scanning mode, the concept may be applied to other configurations.

Additionally, although the preferred embodiment has been illustrated and described, it will be obvious to those skilled in the art that various modifications may be made without departing from the spirit and scope of this invention.

What is claimed is:

1. A reticle thermal management system for use in photolithography comprising:

a heating element placed adjacent a planar surface of a reticle and capable of heating a selected portion of the reticle as the planar surface of the reticle is scanned across said heating element;

an illumination aperture formed adjacent to said heating element, said illumination aperture adapted to provide illumination to an illuminated portion of the reticle; and a control coupled to said heating element, said control causing said heating element to reduce heat provided to the selected portion of the reticle compensating for absorption of electromagnetic radiation when the illuminated portion of the reticle is being illuminated as the reticle is scanned across said heating element, whereby said control selectively causes said heating element to provide heat to the reticle compensating for absorption of electromagnetic radiation and reducing thermal gradients in the reticle.

2. A reticle thermal management system for use in photolithography as in claim 1 further comprising:

a cooling element placed adjacent to said heating element and coupled to said control.

3. A reticle thermal management system for use in photolithography as in claim 2 further comprising:

insulation placed over said heating and cooling elements.

4. A reticle thermal management system for use in photolithography comprising:

a cooling element placed adjacent a reticle and capable of cooling a selected portion of the reticle as the reticle is scanned across said cooling element;

a heating element placed adjacent the reticle and said cooling element and capable of heating a selected portion of the reticle as the reticle is scanned across said heating element;

an illumination aperture formed adjacent to said heating element; and a control coupled to said cooling and heating elements, said control causing said heating element to increase a thermal load on a portion of the reticle when not illuminated by electromagnetic radiation and to decrease the thermal load on the reticle when illuminated by electromagnetic radiation, whereby electromagnetic radiation passes through said illumination aperture illuminating a reticle and projecting an image of the reticle onto a photosensitive substrate.

5. A reticle thermal management system for use in photolithography as in claim 4 wherein:

said heating element is a wire grid.

6. A reticle thermal management system for use in photolithography as in claim 4 wherein:

said heating element is a lamp.

7. A reticle thermal management system for use in photolithography as in claim 4 wherein:

said heating element is a laser operating at a non actinic wavelength.

8. A reticle thermal management system for use in photolithography as in claim 4 wherein:

said illumination aperture has an arcuate shape.

9. A reticle thermal management system for use in photolithography as in claim 4 further comprising:

insulation place over said cooling and heating elements.

10. A reticle thermal management system for use in photolithography as in claim 4 further comprising:

a gas supply, said gas supply providing a gas flow adjacent said reticle.

11. A reticle thermal management system for use in photolithography as in claim 4 wherein:

said control controls said heating and cooling elements spatially.

12. A thermal management system for use in controlling the temperature of a reticle used in photolithography comprising:

a substantially planar heating element placed adjacent the reticle;

a substantially planar cooling element placed adjacent the reticle and surrounding said planar heating element;

an illumination aperture formed in said planar cooling element having a side common with said planar heating element;

a control coupled to said substantially planar heating element, said control causing said substantially planar heating element to provide heat when the reticle is not being illuminated by electromagnetic radiation from an illumination source and not to provide heat when the reticle is being illuminated by electromagnetic radiation from the illumination source, whereby thermal gradients in the reticle due to absorption of the electromagnetic radiation from an illumination source are reduced.

13. A thermal management system for use in controlling the temperature of a reticle used in photolithography as in claim 12 wherein:

said control spatially controls said heating element at different locations.

14. A thermal management system for use in controlling the temperature of a reticle used in photolithography as in claim 12 wherein:

said heating element comprises a wire grid.

15. A thermal management system for use in controlling the temperature of a reticle used in photolithography as in claim 12 wherein:

said heating element comprises a laser.

16. A photolithographic system with reticle thermal management comprising:

an EUV illumination source providing an illumination field;

a reticle stage having a reticle thereon positioned to receive the illumination field;

a heating element placed adjacent the reticle providing heat to a portion of the reticle;

a cooling element placed adjacent the reticle removing heat from the reticle;

a temperature control coupled to said EUV illumination source, said illumination source, and said heating and cooling elements, whereby said temperature control selectively controls thermal energy provided to the reticle by said heating and cooling elements so that thermal gradients due to absorption of electromagnetic radiation by the reticle are reduced;

a substrate stage having a photosensitive substrate thereon;

projection optics placed between the reticle and the photosensitive substrate; and a stage control coupled to said reticle stage and said substrate stage, whereby the image of the reticle is projected onto the photosensitive substrate with reduced distortion due to thermal gradients in the reticle.

17. A thermal management system for use in controlling the temperature of a reticle used in photolithography as in claim 16 wherein:

the illumination field is scanned across the reticle.

18. A thermal management system for use in controlling the temperature of a reticle used in photolithography as in claim 17 wherein:

said temperature control temporally controls the thermal energy during a scanning operation.

19. A thermal management system for use in controlling the temperature of a reticle used in photolithography as in claim 16 wherein:

said projection optics form a reduced image.

20. A thermal management system for use in controlling the temperature of a reticle used in photolithography as in claim 15 wherein:

said temperature control spatially controls the thermal energy in a direction along the illumination field.

21. A thermal management system for use in controlling the temperature of a reticle used in scanning photolithography comprising:

a reticle;

thermal management means, placed adjacent said reticle, for providing thermal energy to a portion of said reticle prior to illumination of said reticle and removing thermal energy from a portion of said reticle during illumination of said reticle such that a thermal load of said reticle from said thermal management means and the illumination of said reticle is maintained substantially constant as said reticle is scanned across said thermal management means, whereby thermal gradients and distortion in the reticle due to absorption of electromagnetic radiation is reduced.

22. A method of controlling thermal distortion of a reticle used in photolithography comprising the steps of:

scanning a reticle across a heating element providing heat sequentially to portions of the reticle as the reticle is scanned across the heating element when the reticle is not being illuminated by an illumination source; and removing heat sequentially from portions of the reticle as the reticle is scanned when an illuminated portion of the reticle is being illuminated by an illumination source, whereby temperature gradients in the reticle are reduced.

23. A method of controlling thermal distortion of a reticle used in photolithography as in claim 22 wherein:

the step of providing heat comprises providing heat equivalent to the heat expected from the absorption of the electromagnetic radiation by the illuminated portion of the reticle when illuminated by the illumination source, and the step of removing heat comprises removing heat equivalent to the heat caused by absorption of the electromagnetic radiation by the illuminated portion of the reticle when illuminated by the illumination source.

24. A reticle thermal management system for use with a scanning photolithographic system having an illumination source for projecting the image of a reticle onto a photosensitive substrate comprising:

a cooling element placed adjacent a portion of the reticle so as to be capable of providing cooling to a portion of the reticle as the reticle is scanned across said cooling element;

an illumination transmitting portion adjacent said cooling element and adapted to transmit electromagnetic radiation from the illumination source to an illuminated portion of the reticle;

a heating element placed adjacent the illumination transmitting portion and a portion of the reticle so as to be capable of providing heat to a portion of the reticle as the reticle is scanned across said heating element; and a control coupled to said cooling element and said heating element, said control balancing cooling provided by said cooling element and heat provided by said heating element so as to result in no net temperature change due to absorption of electromagnetic radiation from illumination of the illuminated portion of the reticle by the illumination source, whereby thermal gradients in the reticle due to absorption of the electromagnetic radiation over portions of the reticle are reduced.

25. A reticle thermal management system used in scanning photolithography for creating an image of a reticle on a photosensitive substrate comprising:

a thermal management device having an illumination aperture placed adjacent the reticle, the illumination aperture being smaller than a planar surface of the reticle, whereby a scanning exposure may be obtained and an entire image of the reticle may be produced onto the photosensitive substrate;

a heating element placed adjacent the illumination aperture and providing heat to the reticle; and control means, coupled to said heating element, for reducing the energy provided by said heating element to compensate for thermal energy created by absorption of electromagnetic radiation in the reticle.

26. A reticle thermal management system for use in scanning photolithography comprising:

a heating element placed adjacent a reticle;

an illumination aperture formed adjacent to said heating element illuminating a portion of the reticle;

a reticle stage holding the reticle and movable in a scan direction;

a stage control coupled to said reticle stage; and a temperature control coupled to said heating element and said stage control, said temperature control controlling said heating element spatially, compensating for any differences in a rate of absorption of electromagnetic radiation when the portion of the reticle is being illuminated, whereby thermal gradients in the reticle are reduced.

27. A reticle thermal management system as in claim 26 wherein:

said heating element is controlled spatially in a direction perpendicular to the scan direction.

28. A reticle thermal management system as in claim 26 further comprising:

a cooling element placed adjacent the reticle and coupled to said temperature control.

* * * * *